United States Patent
Chen

(10) Patent No.: US 6,236,236 B1
(45) Date of Patent: May 22, 2001

(54) 2.5 VOLT INPUT/OUTPUT BUFFER CIRCUIT TOLERANT TO 3.3 AND 5 VOLTS

(75) Inventor: Deng-Yuan David Chen, Fremont, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/324,192

(22) Filed: Jun. 2, 1999

(51) Int. Cl.⁷ .............................................. H03K 19/0185
(52) U.S. Cl. ................... 326/81; 326/31; 326/34; 326/58; 326/71; 327/328; 361/111
(58) Field of Search .................... 326/31, 34, 71, 326/58, 81; 327/328; 361/111

(56) References Cited

U.S. PATENT DOCUMENTS

| | | |
|---|---|---|
| 5,399,917 | 3/1995 | Allen et al. .......................... 327/436 |
| 5,434,531 | 7/1995 | Allen et al. .......................... 327/530 |
| 5,453,953 * | 9/1995 | Dhong et al. .................... 365/189.09 |
| 5,543,733 | 8/1996 | Mattos et al. .......................... 326/81 |
| 5,574,389 | 11/1996 | Chu ........................................ 326/81 |
| 5,576,655 | 11/1996 | Fujihira et al. ....................... 327/537 |
| 5,646,809 | 7/1997 | Motley et al. .......................... 361/56 |
| 5,668,483 * | 9/1997 | Roohparvar ............................ 326/34 |
| 5,719,525 | 2/1998 | Khoury ................................ 327/562 |
| 5,835,420 * | 11/1998 | Lee et al. ......................... 365/189.09 |
| 5,914,844 * | 6/1999 | Lutley et al. .......................... 361/111 |
| 5,933,027 * | 8/1999 | Morris et al. .......................... 326/81 |
| 6,011,681 * | 11/2000 | Ker et al. ............................. 361/111 |
| 6,025,737 * | 2/2000 | Patel et al. ............................. 326/80 |
| 6,049,242 * | 4/2000 | Lutley et al. .......................... 327/333 |

OTHER PUBLICATIONS

John Williams, "Mixing 3V and 5C ICs", IEEE Spectrum, pp. 40–42, Mar. 1993.

Marcel J. M. Pelgram et al., "A 3/5 V Compatible I/O Buffer", IEEE J. Of Solid State Circuits, vol. 30, No. 7, pp. 823–825, Jul. 1995.

Chen, Deng–Yuan "Design of A Mixed 3.3V and 5V PCI I/O Buffer", 96TH8140; pp. 336–339.

Bellaouar & Elmasry "Low–Power Digital VLSI Design/ Circuits And Systems", published by Kluwer Academic Publishers, Chapter 4, pp. 214–233.

* cited by examiner

*Primary Examiner*—Viet Q. Nguyen
(74) *Attorney, Agent, or Firm*—Limbach & Limbach, LLP

(57) ABSTRACT

An apparatus and method of communicating signals between a 2.5 volt internal circuit and both 3.3 and 5 volt external circuits using a P-well. The apparatus includes a circuit having a P-well control circuit and a number of NMOS transistors. The P-well control circuit is configured to receive a P-well control signal and an external signal, and in accordance therewith selectively generate a P-well voltage. The NMOS transistors are coupled to the P-well control circuit. At least one of the NMOS transistors has a bulk region configured to receive the P-well voltage. The NMOS transistors are further configured to receive a 5 volt signal and in accordance therewith selectively generate a 2.5 volt signal. The NMOS transistors are still further configured to receive a 3.3 volt signal and in accordance therewith selectively generate a 2.5 volt signal.

15 Claims, 3 Drawing Sheets

2.5 VOLT INPUT/OUTPUT BUFFER CIRCUIT TOLERANT TO 3.3 AND 5 VOLTS

BACKGROUND OF THE INVENTION

1. Field of the Invention

The present invention relates to input/output buffer circuits. In particular, the invention relates to input/output buffer circuits between a 2.5 volt circuit and a 3.3 or 5 volt circuit.

2. Description of the Related Art

The capability to support multiple power supplies (e.g., 5, 3.3, and 2.5 volts) and signaling specifications has been increasingly required for electronic interface circuits due to market need and process technology advancement. Because of design cycle reduction, development cycle reduction between different process technology generations, and the selection of different generation products from those available on the market to reduce the overall end-product cost, each new generation of interface circuit is desired to be able to work with the prior generation without causing any permanent damage or raising reliability concerns. This kind of device is called an over-voltage protection/tolerant interface circuit, an input/output (I/O) circuit, or a buffer circuit.

In the past, some over-voltage tolerant I/Os have been developed but they only work between two immediately successive generations of circuits. For example, many 3.3 volt powered I/O circuits are tolerant to the prior 5 volt generation. Many 2.5 volt powered I/O circuits are tolerant to 3.3 volt powered circuits. Thus for each generation, the common process technology may only support one prior generation of power supply.

One potential solution is to use a dual gate-oxide process. However, this may incur a higher cost and may be undesirable for most applications, in which lowering costs is often the driving design goal.

FIG. 1 shows a typical bi-directional I/O circuit without over-voltage tolerance circuits. Illustrated are an output enable signal node 40, an output internal signal node 42, an inverter 44, a NAND gate 46, a NOR gate 48, a PMOS transistor 50, an NMOS transistor 52, an internal power supply node 54, a ground node 56, an external node 58, a noninverting buffer 60, and an input internal signal node 62. When the output enable signal node 40 is high, the buffer circuit is output enabled and the signal at output internal signal node 42 can be sent to the external node 58. When the output enable signal node 40 is low, the buffer circuit is output disabled and the external node 58 is in a high impedance state. If there is an incoming signal, it will be sent from the external node 58 to the input internal signal node 62.

FIG. 2 shows an existing 3.3/5 volt tolerant I/O circuit that includes a floating N-well 80, an output enable signal node 82, an output internal signal node 84, a NAND gate 86, an inverter 88, a NOR gate 90, an internal power supply node 92, a ground node 94, an I/O power supply node 96, an I/O ground node 98, NMOS transistors 100, 112, 114, 116, 118 and 134, PMOS transistors 102, 104, 106, 108, 110 and 138, nodes 120, 122 and 124, an external node 128, an inverter 136, a noninverting buffer 130, and an input internal signal node 132. The floating N-well 80 connects to the bulk nodes of the transistors 102, 104, 106, 108 and 110 that are exposed to 5 volts.

In the case of output disabled, nodes 120 and 122 are supposed to be high and low, respectively, to force transistors 106 and 118 into a high impedance state. If the external node 128 is driven from outside with 5 volts, transistor 116 protects the gate oxide of transistor 118 from the destructive 5 volts. On the other hand, node 120 is charged to 5 volts via transistor 108 and node 124 is charged to 5 volts via transistors 108 and 110, turning off transistors 100 and 102, so that the output of NAND gate 86 is isolated from the 5 volts on node 120. In the meantime, the floating N-well 80 is charged to 5 volts minus $V_{diode}$ via various parasitic source or drain P/N junctions, where $V_{diode}$ is the voltage drop across these junctions. This ensures that the potential difference between any gate oxide of those transistors exposed to the 5 volts in the circuit is less than the allowable voltage.

In the case of output enabled, node 124 is charged to 0 volts via transistors 112 and 114, so that the 5 volt tolerant circuits will not affect circuit performance in the normal output mode.

However, this 3.3/5 volt tolerant I/O circuit may not work when the process technology moves to a 2.5 volt power supply. Based on the JEDEC extended 5 volt signaling specifications (JESD12-6), the maximum voltage on the external node is 5.5 volts. From the 2.5 volt, 0.25 micron fabrication processes and related electrical specifications, the minimum power supply is 2.3 volts and the absolute maximum supply voltage (destructive) is 3.25 volts. That is, the voltage drop across any drain-gate, gate-source or gate-bulk of a transistor cannot exceed 3.25 volts. This may also be true for drain-bulk or source-bulk regions due to higher surface doping concentration and shallow source or drain P/N junctions for deep submicron CMOS technology.

Thus, when the circuit of FIG. 2 is implemented at 0.25 micron fabrication process and powered by a 2.5 volt power supply, the biggest node-to-node voltage drop in the transistors, e.g., the drain-bulk voltage drop of transistor 116, may not be tolerant to 5.5 volts.

SUMMARY OF THE INVENTION

The present invention addresses these and other problems of existing circuits with a 2.5 volt powered I/O circuit that is tolerant to both 3.3 and 5 volt circuits.

According to one embodiment, an apparatus according to one embodiment of the present invention includes a buffer circuit for communicating signals between an internal circuit having a low power supply voltage and an external circuit having a power supply voltage above that of the internal circuit. The apparatus includes a P-well control circuit and a number of NMOS transistors. The P-well control circuit is configured to receive a P-well control signal and an external signal, and in accordance therewith selectively generate a P-well voltage. The plurality of NMOS transistors is coupled to the P-well control circuit. At least one of the plurality of NMOS transistors has a bulk region configured to receive the P-well voltage. The plurality of NMOS transistors is further configured to receive the external signal having a first potential, and in accordance therewith selectively generate an internal signal having a second potential less than the first potential. The plurality of NMOS transistors is still further configured to receive the external signal having a third potential, and in accordance therewith selectively generate the internal signal having the second potential. The third potential is between the first potential and the second potential.

According to another embodiment, a method according to another embodiment of the present invention protects an internal circuit having a low power supply voltage from a signal communicated by an external circuit having a power supply voltage above that of the internal circuit. The method includes the steps of receiving an external signal having one of a first potential and a second potential; generating a P-well voltage corresponding to the external signal; providing the P-well voltage to a bulk region of at least one NMOS transistor; and generating an internal signal having a third potential and corresponding to the external signal. The third potential is less than the second potential, which is less than the first potential.

DETAILED DESCRIPTION OF THE PREFERRED EMBODIMENTS

This disclosure assumes the 2.5 volt power supply is EIA/JEDEC (EIA/JESD8-5) standard, with a normal range power supply whose minimum, typical and maximum voltages are 2.3, 2.5 and 2.7 volts, respectively.

Figure 1:
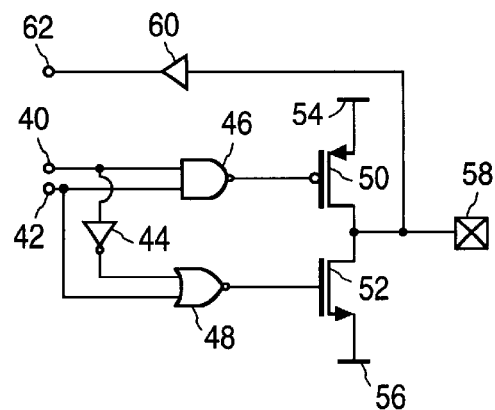
FIG. 1 is a circuit diagram of an existing input/output buffer circuit.
Figure 2:
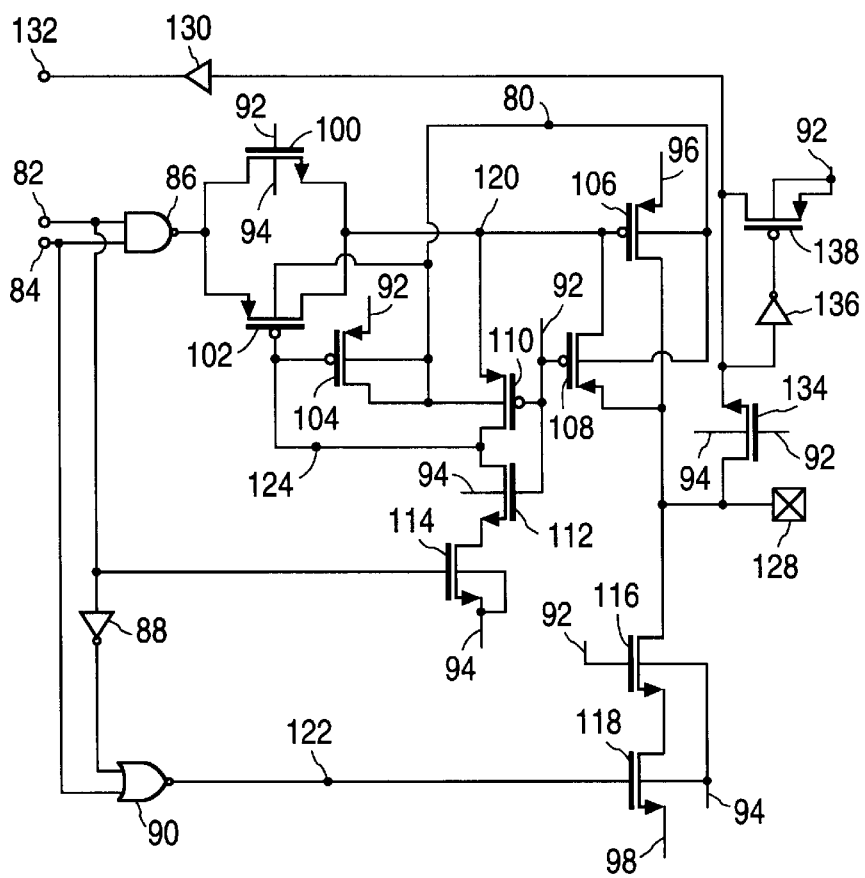
FIG. 2 is a circuit diagram of an existing overvoltage input/output buffer circuit.
Figure 3:
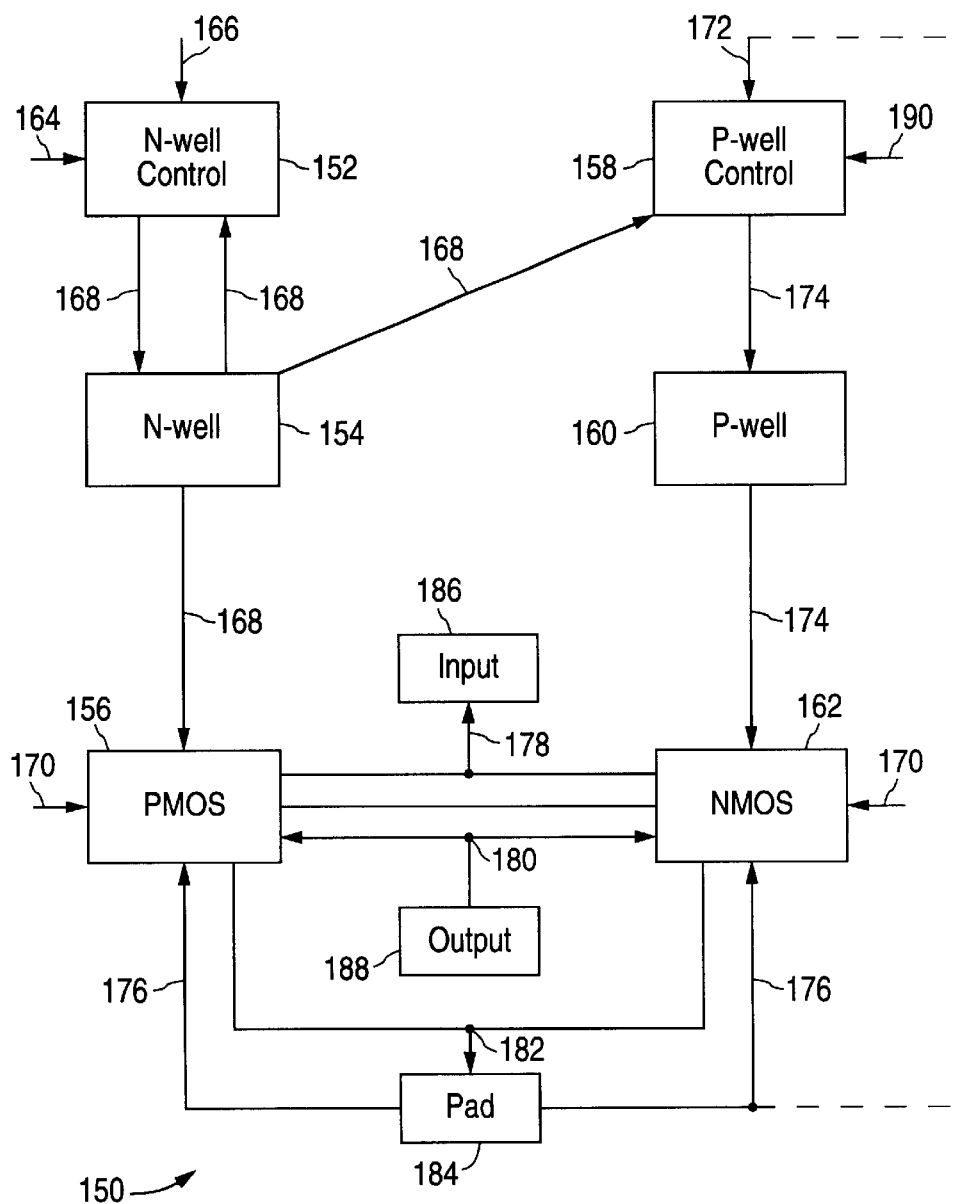
FIG. 3 is a block diagram of one embodiment of the present invention.

FIG. 3 is a block diagram of a buffer circuit 150 according to one embodiment of the present invention. The buffer circuit 150 includes an N-well control circuit 152, an N-well 154, a PMOS circuit 156, a P-well control circuit 158, a P-well 160 and an NMOS circuit 162.

The N-well control circuit 152 is configured to receive an N-well control signal 164 and a voltage 166. The N-well control signal 164 controls generation of an N-well voltage 168 based on the voltage 166. The N-well 154 supplies the N-well voltage 168 to the PMOS circuit 156. The N-well 154 may also supply the N-well voltage 168 to the N-well control circuit 152 and the P-well control circuit 158.

The P-well control circuit 158 is configured to receive a P-well control signal 190 and a voltage 172. The P-well control signal 190 controls generation of a P-well voltage 174 based on the voltage 172. The P-well 160 supplies the P-well voltage 174 to the NMOS circuit 162.

The PMOS circuit 156 includes a number of PMOS transistors, at least one of which having a bulk region configured to receive the N-well voltage 168. The NMOS circuit 162 includes a number of NMOS transistors, at least one of which having a bulk region configured to receive the P-well voltage 174.

The NMOS and PMOS circuits 162 and 156 are configured to receive an external signal 176 and in accordance therewith generate an internal signal 178. The external signal 176 is also provided to the P-well control circuit as the voltage 172. The P-well 160 and the N-well 154 help protect the NMOS and PMOS circuits 162 and 156 from the external signal 176 when buffer circuit 150 operates in an input mode, as described below.

The NMOS and PMOS circuits 162 and 156 may be further configured to receive an output enable signal 170 and an output internal signal 180, and in accordance therewith generate an output external signal 182 when buffer circuit 150 operates in an output mode, as described below.

In the input mode, buffer circuit 150 receives the external signal 176 from an external node 184 and generates the internal signal 178 at an input internal node 186. Buffer circuit 150, and the NMOS and PMOS circuits 162 and 156, operate at a low voltage. In a preferred embodiment this low voltage is approximately 2.5 volts. When the external signal 176 is above 2.5 volts, this may damage the circuits as described above. The N-well 154 and P-well 160 protect the NMOS and PMOS circuits 162 and 156 by adjusting the relative voltage potential between nodes of the circuit elements.

The N-well 154 and P-well 160 protect over a wide range of external signal voltages. In a preferred embodiment, the buffer circuit 150 may receive external signal voltages both at approximately 3.3 volts and approximately 5 volts.

In the output mode, buffer circuit 150 receives the output internal signal 180 from an output internal node 188 and the output enable signal 170. The buffer circuit 150 then generates the output external signal 182 at the external node 184. (Preferably internal node 186 and internal node 188 are not the same node.) The N-well control signal 164 and the P-well control signal 190 are based on the output enable signal 170. The N-well control circuit 152 uses the N-well control signal 164 to control generation of the N-well voltage 168. The P-well control circuit 158 uses the P-well control signal 190 to control generation of the P-well voltage 174. In a preferred embodiment the output internal signal 180 and output external signal 182 are approximately 2.5 volts.

Figure 4:
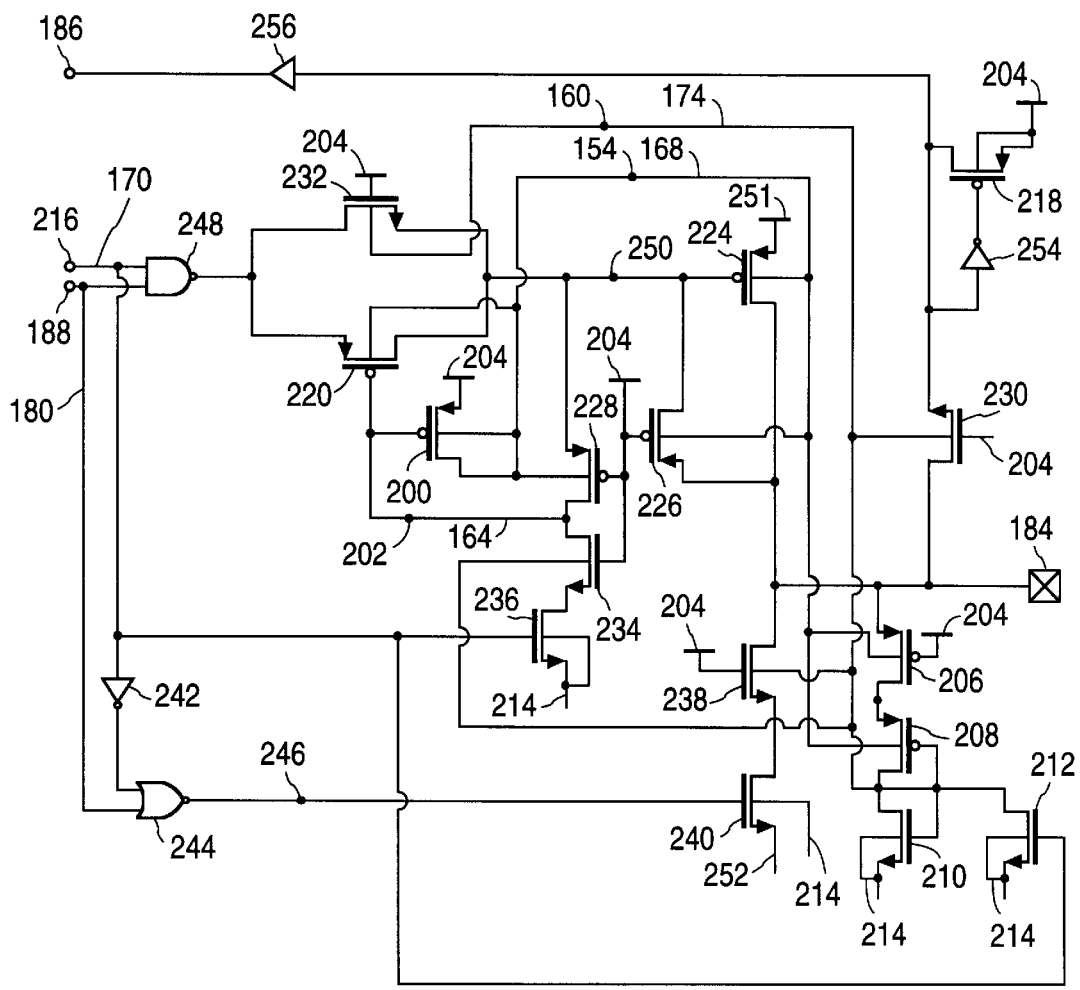
FIG. 4 is a circuit diagram of a more specific embodiment of the present invention.

FIG. 4 is a circuit diagram showing more details of the buffer circuit 150. The N-well control circuit 152 (see FIG. 3) includes a PMOS transistor 200. The gate of transistor 200 is connected to an N-well control node 202 to receive the N-well control signal 164 based on the output enable signal 170 (see FIG. 3). The source of transistor 200 is connected to a voltage source node 204 which supplies the voltage 166 (see FIG. 3). The voltage source 204 preferably supplies a low voltage, most preferably approximately 2.5 volts. The bulk and drain of transistor 200 are connected to the N-well 154.

The P-well control circuit 158 (see FIG. 3) includes PMOS transistors 206 and 208, and NMOS transistors 210 and 212. The source of transistor 206 is connected to the external node 184. The bulk of transistor 206 is connected to the N-well 154. The gate of transistor 206 is connected to a low voltage source, preferably the voltage source node 204.

The drain of transistor 206 is connected to the source of the transistor 208. The bulk of transistor 208 is connected to the N-well 154. The gate and drain of transistor 208 are connected to the P-well 160.

The gate and drain of transistor 210 are connected to the P-well 160. The bulk and source of transistor 210 are connected to ground, preferably a ground node 214.

The drain of transistor 212 is connected to the P-well 160. The bulk and source of transistor 212 are connected to ground, preferably the ground node 214. The gate of transistor 212 is connected to an output enable node 216 to receive the output enable signal 170 as the P-well control signal 190 (see FIG. 3).

The PMOS circuit 156 (see FIG. 3) includes transistors 218, 220, 224, 226, and 228. The NMOS circuit 162 (see FIG. 3) includes transistors 230, 232, 234, 236, 238, and 240. The source of transistor 224 is connected to an I/O power supply node 251. The source of transistor 240 is connected to an I/O ground node 252. The connections and functions of all these transistors will be explained below with reference to the input mode and output mode operation of the buffer circuit 150.

Input Mode

In an input mode, the buffer circuit 150 receives the external signal 176 (see FIG. 3) at the external node 184 from an external circuit (not shown). The external signal 176 may be at a voltage above that of the power supplied to buffer circuit 150, for example, approximately 3.3 or approximately 5 volts. The buffer circuit 150 then converts the external signal into a low voltage internal signal 178 (for example, 2.5 volts) (see FIG. 3) at the internal node 186 for communication with an internal circuit (not shown).

More specifically, when the output enable node 216 is low, inverter 242 and NOR gate 244 cause node 246 to go low. Similarly, NAND gate 248 and transistors 232, 220, and 236 cause node 250 to go high. The low voltage at node 246 and the high voltage at node 250 cause transistors 224 and 240 to turn off.

When the external circuit (not shown) applies a 5.5 volt external signal 176 (see FIG. 3) to external node 184, transistor 226 charges node 250 to 5.5 volts. This turns transistor 224 off. Transistor 228 turns on and charges node 202 to 5.5 . Transistor 220 then turns off, protecting NAND gate 248 from the 5.5 volts at node 250. Although transistor 232 is on as long as the voltage at node 204 is higher than that at P-well 160, transistor 232 limits the voltage on the output node of NAND gate 248 to the voltage of node 204 minus the threshold voltage of transistor 232. In other words, without considering the effect of transistor 220, the high logic state of the output of NAND gate 248 is not affected by the voltage level of node 250. Otherwise, transistor 232 turns off when the P-well 160 is charged to a voltage higher than that of node 204.

The voltage of N-well 154 is therefore charged to 5.5 volts minus the P/N junction build-in voltage (about 0.2 volts) by all of the parasitic source or drain P/N junction potentials of PMOS transistors 224, 226, 228, 200, 220, 206, and 208.

The 5.5 volts on external node 184 also cause transistors 206 and 208 to turn on and transistor 210 to turn off, generating a P-well voltage 174 (see FIG. 3) at P-well 160. (Transistor 212 is off because node 216 is low in the input mode.) By sizing the transistors 206, 208, 210 and other transistors that share the P-well 160, the resulting P-well voltage 174 should be higher than 2.25 volts (5.5–3.25= 2.25), so that the voltage drop between the drain and bulk of transistor 238 would be less than the allowed voltage of 3.25 volts. Other the other hand, assuming that the voltage supply node 204 supplies the minimum preferred voltage of 2.3 volts, the voltage drop on the gate oxide of these transistors is approximately 3.2 volts (5.5=2.3=3.2), which is also lower than 3.25 volts.

Given these constraints, transistors 206, 208 and 210 must be designed very carefully so that the P-well voltage 174 is between approximately 2.25 (5.5–3.25) and 3.25 volts when the external signal is at 5.5 volts.

Finally, transistors 218 and 230, inverter 254 and noninverting buffer 256 receive the external signal 176 and generate the internal signal 178 (see FIG. 3) at internal node 186. Suppose the internal power supply voltage (at node 204) is 2.5 volts and the output is disabled. If the voltage on external node 184 is 2.5 volts, then the voltage on the other terminal (source) of transistor 230 would be 2.5 volts minus its threshold voltage, i.e., 2.5–0.5=2.0 volts, which is lower than 2.5 volts. The function of inverter 254 and PMOS gate 218 is to pull up the internal line from 2.0 volts to 2.5 volts.

The choice of the 5.5 volt external signal in the above example is based on the maximum voltage allowed under JEDEC extended 5 volt signaling specifications (JESD12-6). A similar analysis results when an approximately 3.3 volt external signal is applied at the external node 184.

Output Mode

In an output mode, buffer circuit 150 receives output internal signal 180 (see FIG. 3) at internal node 188 from the internal circuit (not shown). Buffer circuit 150 then generates output external signal 182 (see FIG. 3) at external node 184 for communication with the external circuit (not shown). Buffer circuit 150 uses N-well control signal 164 and P-well control signal 190 (both based on output enable signal 170) (see FIG. 3) to isolate circuit components not used in the output mode so that these unused components do not affect circuit performance.

More specifically, output enable node 216 is high, causing transistor 212 to discharge P-well 160 to ground. The internal circuit (not shown) applies the output internal signal 180 (see FIG. 3), preferably a 2.5 volt signal, to output internal node 188. When output internal signal 180 is high, node 250 is low and node 246 is low, causing transistors 224 and 240 to supply a high signal from I/O power supply node 251 to external node 184. When the output internal signal 180 is low, node 250 is high and node 246 is high, causing transistors 224 and 240 to supply a low signal from 1/0 ground node 252 to the external node 184.

When the power supply (preferably connected to node 204) of buffer circuit 150 is approximately 2.5 volts, node 250 goes to a maximum potential of approximately 2.7 volts under transient conditions. Similarly, output node 184 is a maximum of approximately 2.7 volts under transient conditions as well. Under steady state conditions, node 250 is approximately 2.5 volts. This causes transistors 226, 228 and 206 to be off. Node 202 is discharged to ground by transistors 234 and 236, so transistor 220 is on. The N-well 154 is charged to the power supply voltage of node 204 by transistor 200. Thus, the N-well and P-well control circuits 152 and 158 (see FIG. 3) do not affect the output buffer performance, even as modified with the improvements of the present invention.

Simulation results of buffer circuit 150 give results in conformance with the above discussion.

It should be understood that various alternatives to the embodiments of the invention described herein may be employed in practicing the invention. It is intended that the following claims define the scope of the invention and that structures within the scope of these claims and their equivalents are covered thereby.

What is claimed is:

1. An apparatus including a buffer circuit for communicating signals between an internal circuit having a low power supply voltage and an external circuit having a power supply voltage above that of said internal circuit, comprising:

a P-well control circuit configured to receive a P-well control signal and an external signal, and in accordance therewith selectively generate a P-well voltage; and a plurality of NMOS transistors, coupled to said P-well control circuit, at least one of said plurality of NMOS transistors having a bulk region configured to receive said P-well voltage;

wherein said plurality of NMOS transistors is further configured to receive said external signal having a first potential, and in accordance therewith to selectively generate an internal signal having a second potential less than said first potential, and wherein said plurality of NMOS transistors is still further configured to receive said external signal having a third potential, and in accordance therewith to selectively generate said internal signal having said second potential, wherein said third potential is between said first potential and said second potential.

2. The apparatus of claim 1, further comprising an external node configured to receive said external signal, an internal node configured to receive said internal signal, a P-well node configured to receive said P-well voltage, a control node configured to receive said P-well control signal, and a power supply node, wherein said P-well control circuit comprises:
- a first PMOS transistor having a source coupled to said external node, a gate configured to receive an internal supply voltage, and a drain;
- a second PMOS transistor having a source coupled to said first PMOS transistor drain, a gate coupled to said P-well node, and a drain coupled to said P-well node;
- a first NMOS transistor having a drain coupled to said P-well node, a gate coupled to said P-well node, a bulk coupled to said power supply node, and a source coupled to said power supply node; and
- a second NMOS transistor having a drain coupled to said P-well node, a bulk coupled to said power supply node, a source coupled to said power supply node, and a gate coupled to said control node;
- wherein said first and second NMOS and said first and second PMOS transistors are configured to selectively generate at said P-well node a voltage less than a voltage at said external node when said voltage at said external node exceeds said internal supply voltage, and
- wherein said first and second NMOS and said first and second PMOS transistors are further configured to selectively generate at said P-well node a voltage approximately equal to a voltage at said power supply node in response to said P-well control signal.

3. The apparatus of claim 2, wherein:
said internal supply voltage is approximately 2.5 volts; and
said power supply node is a ground node.

4. The apparatus of claim 1, further comprising an external node configured to receive said external signal, wherein:
said plurality of NMOS transistors is further configured to receive an output enable signal and an output internal signal having said second potential, and in accordance therewith to selectively generate at said external node an output external signal having said second potential.

5. The apparatus of claim 1, wherein:
said first potential is approximately 5 volts;
said second potential is approximately 2.5 volts; and
said third potential is approximately 3.3 volts.

6. An apparatus including a buffer circuit for communicating signals between an internal circuit having a low power supply voltage and an external circuit having a power supply voltage above that of said internal circuit, comprising:
- an N-well control circuit configured to receive an N-well control signal and an internal supply voltage, and in accordance therewith to selectively generate an N-well voltage;
- a plurality of PMOS transistors, coupled to said N-well control circuit, at least one of said plurality of PMOS transistors having a bulk region configured to receive said N-well voltage;
- a P-well control circuit configured to receive a P-well control signal and an external signal, and in accordance therewith to selectively generate a P-well voltage;
- a plurality of NMOS transistors, coupled to said P-well control circuit and said plurality of PMOS transistors, at least one of said plurality of NMOS transistors having a bulk region configured to receive said P-well voltage;
- wherein said plurality of PMOS transistors and said plurality of NMOS transistors are further configured to receive said external signal having a first potential, and in accordance therewith to selectively generate an internal signal having a second potential less than said first potential, and
- wherein said plurality of PMOS transistors and said plurality of NMOS transistors are still further configured to receive said external signal having a third potential, and in accordance therewith to selectively generate said internal signal having said second potential, wherein said third potential is between said first potential and said second potential.

7. The apparatus of claim 6, further comprising an internal power supply node configured to receive said internal supply voltage, an N-well control node configured to receive said N-well control signal, and an N-well node configured to receive said N-well voltage, wherein said N-well control circuit comprises:
- a PMOS transistor having a source coupled to said internal power supply node, a gate coupled to said N-well control node, a bulk region coupled to said N-well node, and a drain coupled to said N-well node.

8. The apparatus of claim 6, further comprising an external node configured to receive said external signal, an N-well control node configured to receive said N-well control signal, an N-well node configured to receive said N-well voltage, a P-well node configured to receive said P-well voltage, a P-well control node configured to receive said P-well control signal, and a power supply node, wherein said P-well control circuit comprises:
- a first PMOS transistor having a source coupled to said external node, a bulk region coupled to said N-well node, a gate configured to receive an internal supply voltage, and a drain;
- a second PMOS transistor having a source coupled to said first PMOS transistor drain, a bulk region coupled to said N-well node, a gate coupled to said P-well node, and a drain coupled to said P-well node;
- a first NMOS transistor having a drain coupled to said P-well node, a gate coupled to said P-well node, a bulk region coupled to said power supply node, and a source coupled to said power supply node; and
- a second NMOS transistor having a drain coupled to said P-well node, a bulk region coupled to said power supply node, a source coupled to said power supply node, and a gate coupled to said P-well control node;
- wherein said first and second NMOS and said first and second PMOS transistors are configured to selectively generate at said P-well node a voltage less than a voltage at said external node when said voltage at said external node exceeds said internal supply voltage, and
- wherein said first and second NMOS and said first and second PMOS transistors are further configured to selectively generate at said P-well node a voltage approximately equal to a voltage at said power supply node in response to said P-well control signal.

9. The apparatus of claim 8, wherein:
said internal supply voltage is approximately 2.5 volts; and
said power supply node is a ground node.

10. The apparatus of claim 6, further comprising an external node configured to receive said external signal, wherein:
said plurality of PMOS transistors and said plurality of NMOS transistors are further configured to receive an output enable signal and an output internal signal having said second potential, and in accordance therewith to selectively generate, at said external node, an output external signal having said second potential.

11. The apparatus of claim 6, wherein:

said first potential is approximately 5 volts;

said second potential is approximately 2.5 volts; and said third potential is approximately 3.3 volts.

12. A method of protecting an internal circuit having a low power supply voltage from a signal communicated by an external circuit having a power supply voltage above that of said internal circuit, comprising the steps of:

receiving an external signal having one of a first potential and a second potential, wherein said second potential is less than said first potential;

generating a P-well voltage corresponding to said external signal;

providing said P-well voltage to a bulk region of at least one NMOS transistor; and generating an internal signal having a third potential and corresponding to said external signal, wherein said third potential is less than said second potential.

13. The method of claim 12, further comprising the steps of:

generating an N-well voltage corresponding to said external signal; and providing said N-well voltage to a bulk region of at least one PMOS transistor.

14. The method of claim 12, further comprising the steps of:

receiving an output internal signal having said third potential; and providing said output internal signal to said external circuit, wherein said steps of receiving and providing said output internal signal are performed before said step of receiving said external signal.

15. The method of claim 12, further comprising the steps of:

receiving an output internal signal having said third potential; and providing said output internal signal to said external circuit, wherein said steps of receiving and providing said output internal signal are performed after said step of generating an internal signal.

* * * * *